(12) United States Patent
Matsuyama

(10) Patent No.: US 6,198,576 B1
(45) Date of Patent: Mar. 6, 2001

(54) PROJECTION OPTICAL SYSTEM AND EXPOSURE APPARATUS

(75) Inventor: Tomoyuki Matsuyama, Tokyo (JP)

(73) Assignee: Nikon Corporation, Tokyo (JP)

( * ) Notice: Subject to any disclaimer, the term of this patent is extended or adjusted under 35 U.S.C. 154(b) by 0 days.

(21) Appl. No.: 09/116,644

(22) Filed: Jul. 16, 1998

(51) Int. Cl.[7] ............................. G02B 3/00; G03B 27/54
(52) U.S. Cl. ..................... 359/649; 359/650; 359/651; 359/740; 359/766; 355/67; 355/53
(58) Field of Search ..................... 359/766, 649–651, 359/656–661, 740; 355/67, 53

(56) References Cited

U.S. PATENT DOCUMENTS

| 4,666,273 | 5/1987 | Shimizu et al. | 353/101 |
|---|---|---|---|
| 4,730,900 | 3/1988 | Uehara et al. | 359/820 |
| 4,801,977 | 1/1989 | Ishizaka et al. | 355/30 |
| 4,871,237 | 10/1989 | Anzai et al. | 359/667 |
| 4,907,021 | 3/1990 | Yabu | 353/101 |
| 4,920,505 | 4/1990 | Suzuki | 399/51 |
| 5,105,075 | 4/1992 | Ohata et al. | 250/201.2 |
| 5,270,771 | 12/1993 | Sato | 355/53 |
| 5,337,097 | 8/1994 | Suzuki et al. | 353/101 |
| 5,448,333 | 9/1995 | Iowamoto et al. | 355/53 |
| 5,691,802 | * 11/1997 | Takahashi | 355/53 |
| 5,781,278 | * 7/1998 | Matsuzawa et al. | 355/53 |
| 5,808,814 | * 9/1998 | Kudo | 359/754 |
| 5,835,227 | * 11/1998 | Grodnensky et al. | 356/399 |
| 5,852,490 | * 12/1998 | Matsuyama | 355/67 |

FOREIGN PATENT DOCUMENTS 3-88317    4/1991    (JP) .

OTHER PUBLICATIONS

Hecht, Eugene, "Optics: Second Edition," Addison–Wesley Publishing Company, Reading, Massachusetts, pp. 228–229, Apr. 1988.*

* cited by examiner

Primary Examiner—Georgia Epps
Assistant Examiner—Evelyn A. Lester
(74) Attorney, Agent, or Firm—Beyer Weaver & Thomas, LLP

(57) ABSTRACT

Projection optical systems are provided for use in an exposure apparatus that have a numerical aperture greater than 0.63, a reduced field curvature of pupil at the aperture stop and are able to maintain imaging performance. Further, the present invention avoids degradation in the imaging performance when the numerical aperture is changed.

21 Claims, 10 Drawing Sheets

Ray bundle for small NA

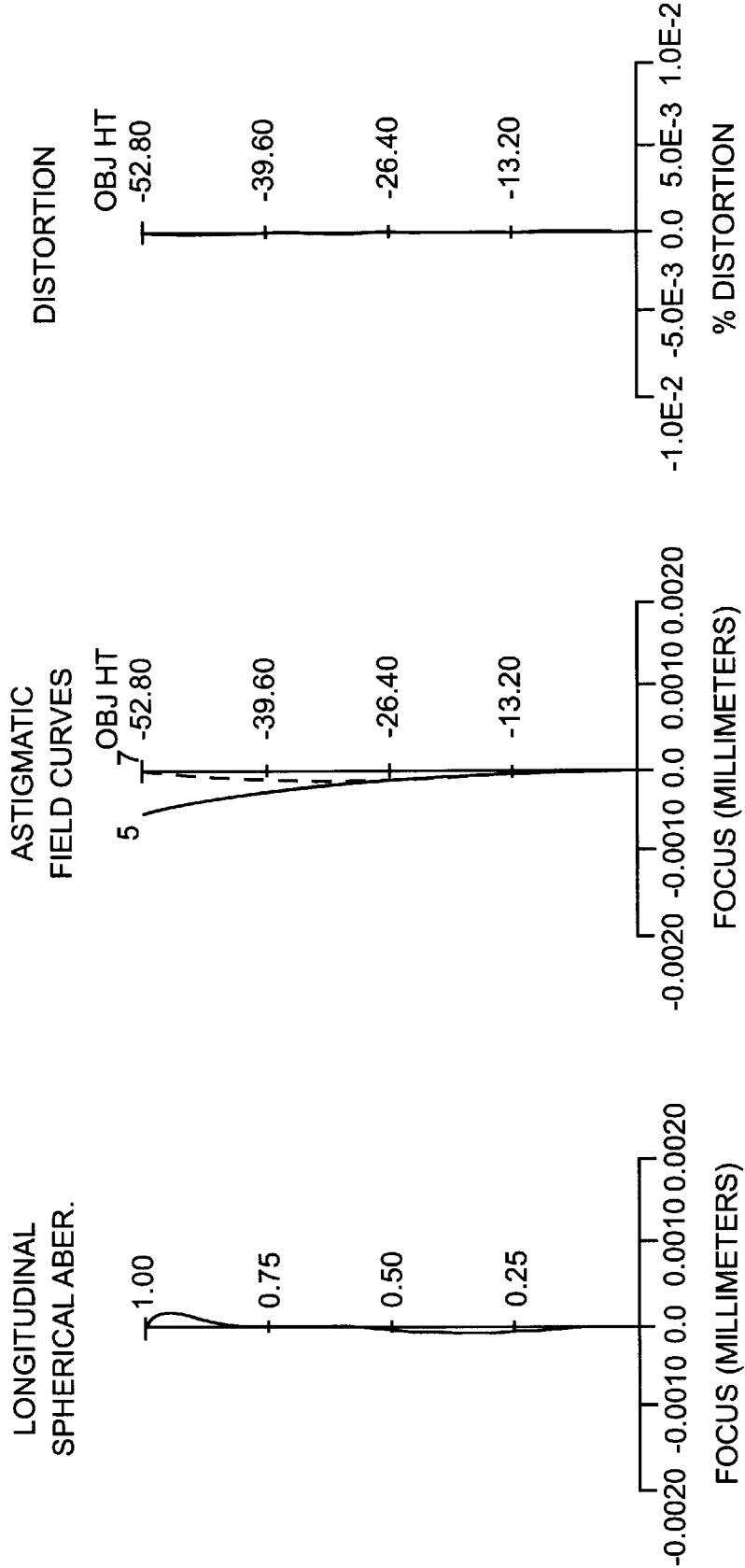

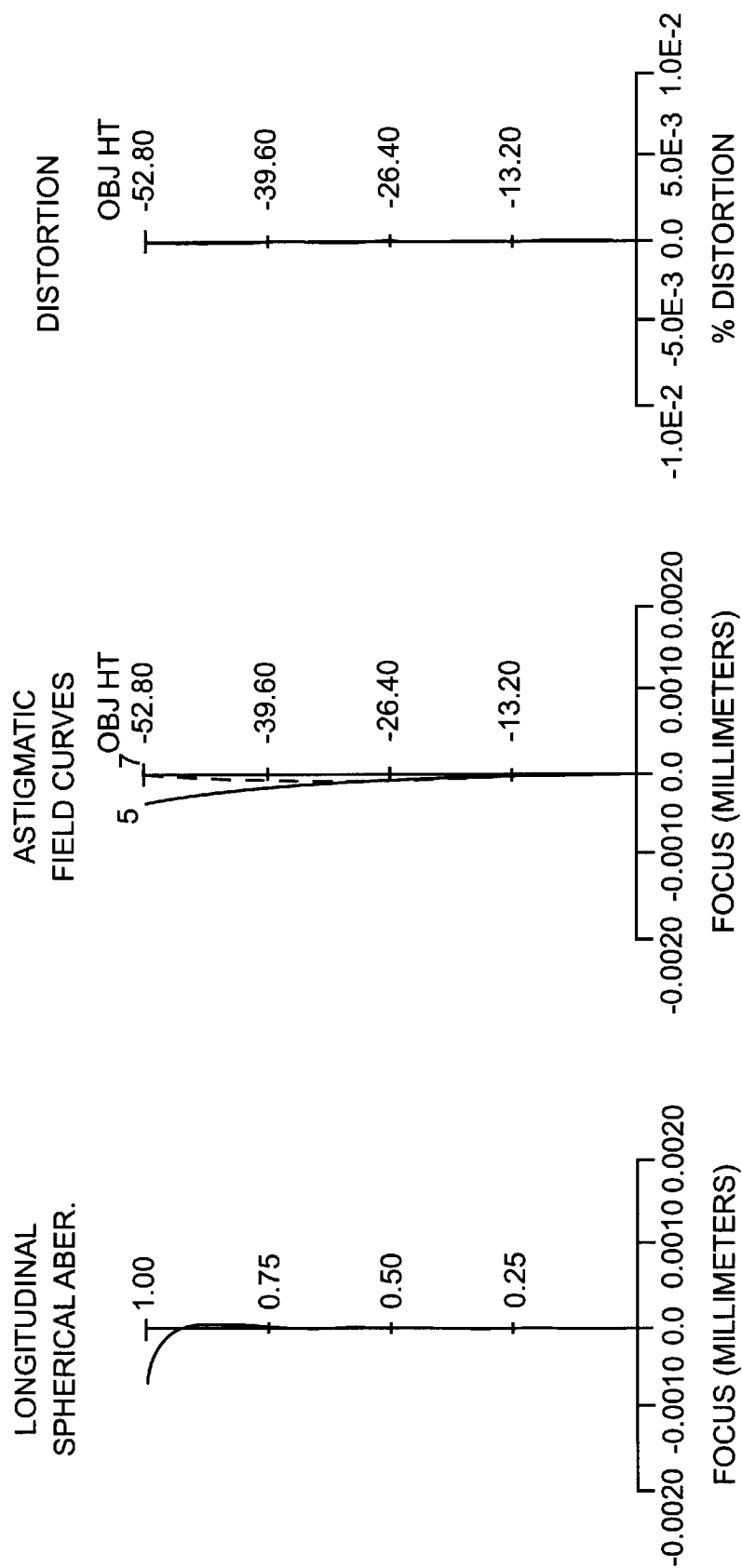

PROJECTION OPTICAL SYSTEM AND EXPOSURE APPARATUS

FIELD OF THE INVENTION

The present invention relates to a projection optical system for projecting a pattern on a first object onto a second object. More particularly, the invention concerns a projection optical system for use in a lithographic system for projecting a pattern formed on a reticle (or mask) onto a substrate (e.g., silicon wafer, glass plate, etc.).

BACKGROUND OF THE INVENTION

As the resolution for integrated circuit patterns increases, higher performance is being demanded of projection optical systems that are used to project an image from a reticle or mask onto a semiconductor wafer or substrate. In current projection optical systems, in order to meet such demands, the resolving power of the projection optical system can conceivably be improved by increasing the numerical aperture (NA) of the projection optical system. In addition, such optical systems are normally double telecentric to avoid magnification errors and have the capability to vary the numerical aperture to obtain the appropriate conditions for imaging the integrated circuit patterns.

Referring to FIG. 1A, one problem associated with current projection optical systems is the existence of a certain amount of field curvature of pupil at the pupil location. This occurs because a mechanical aperture stop is in a plane, and when the numerical aperture is changed, phenomena such as asymmetrical vignetting occurs. As seen in FIG. 1A, a projection optical system may be broken down into two parts, one part on a first object side of the aperture stop having a first Petzval sum (ptz(1)), and another part on a second object side of the aperture stop having a second Petzval sum (ptz(2)). Referring to FIG. 1B, when the NA is decreased, asymmetrical vignetting occurs, resulting in a degradation of the imaging performance of the projection optical system. Phenomena such as asymmetrical vignetting cause degradation in the imaging performance of the projection optical system as a whole. Due to the current resolution limits required in projection optical systems, these degradations could be ignored. However, as systems seek to improve resolution and utilize projection optical systems having a higher NA (e.g., NA>0.63), field curvature of pupil at the aperture stop and other asymmetrical phenomena present a much more serious problem and cannot be ignored.

Therefore, what is needed are projection optical systems having high numerical apertures and minimum field curvature of pupil in the aperture stop plane.

SUMMARY OF THE INVENTION

The present invention overcomes the above and other problems associated with prior art projection optical systems. More specifically, the present invention reduces the field curvature of pupil in the aperture stop plane while maintaining imaging performance. Further, the present invention avoids degradation in the imaging performance when the numerical aperture is changed.

One embodiment of the present invention which achieves the above and other objects of the present invention includes a projection optical system having a numerical aperture of 0.63 or greater and satisfies the following conditions:

$$-0.000005 < PTZ(1) + PTZ(2) < 0.000005 \qquad (1)$$

$$-0.005 < PTZ(1) < 0.005 \qquad (2)$$

where, $PTZ(1)$ is the amount of Petzval sum between first object and the aperture stop; and $PTZ(2)$ is the amount of Petzval sum between the aperture stop and the second object.

The projection optical system according to the present invention can be utilized with various exposure systems that perform a one-shot exposure method, such as the step and repeat exposure systems, or with systems which perform a scanning exposure method.

An exposure apparatus utilizing the projection optical system of the present invention includes a first stage capable of holding a wafer with a photosensitive substrate on the main surface thereof. A second stage is included for holding a mask thereon. An illumination optical system is provided for illuminating a pattern on the mask to form an image. A projection optical system is disposed between the mask and the substrate to project the image formed by the illumination system onto the substrate.

A projection optical system in accordance with the present invention for use in the above-mentioned exposure apparatus includes, from the reticle side thereof, a first lens group having a positive refractive power, a second lens group having a negative refractive power, a third lens group having a positive refractive power, a fourth lens group having a negative refractive power, a fifth lens group having a positive refractive power and an aperture stop placed within the fifth lens group.

These and other advantages of the present invention will become more apparent upon a reading of the detailed description of the preferred embodiments which follows, when considered in conjunction with the drawings of which the following is a brief description. It should be clear that the drawings are merely illustrative of the currently preferred embodiments of the present invention, and that the invention is in no way limited to the illustrated embodiments. The present invention is best defined by the claims appended to this specification.

BRIEF DESCRIPTION OF THE DRAWINGS

The accompanying drawings incorporated in and forming a part of the specification, illustrate the present invention, and together with the detailed description below serve to explain the principles of the invention. In the drawings:

FIG. 5 is a graphical representation of the spherical aberration associated with the projection optical system of FIG. 3;

FIG. 6 is a graphical representation of astigmatic field curves associated with the projection optical system of FIG. 3;

FIG. 7 is a graphical representation of distortion associated with the projection optical system of FIG. 3;

FIG. 9 is a graphical representation of the spherical aberration associated with the projection optical system of FIG. 4;

FIG. 10 is a graphical representation of astigmatic field curves associated with the projection optical system of FIG. 4;

FIG. 11 is a graphical representation of distortion associated with the projection optical system of FIG. 4;

DETAILED DESCRIPTION OF THE PREFERRED EMBODIMENTS

Figures 1A, 1B:
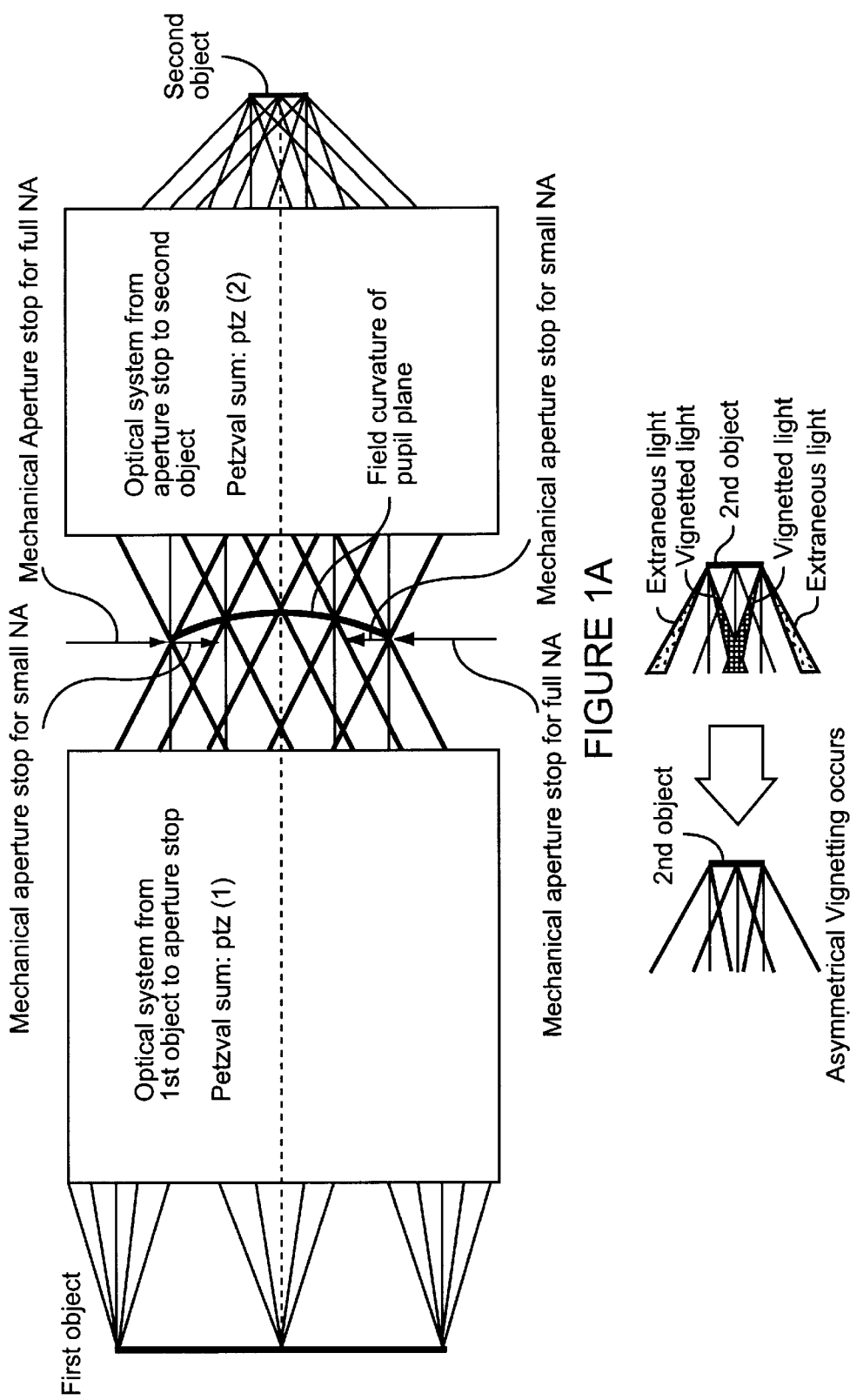
FIG. 1A is a schematic drawing of a conventional double telecentric projection optical system having field curvature of pupil at the pupil.
FIG. 1B illustrates asymmetrical vignetting for a small numerical aperture.

The following detailed description is of the presently preferred embodiments of the present invention. It is to be understood that while the detailed description is provided in conjunction with FIGS. 2–14 briefly described above, the invention is not limited to the illustrated embodiments. In the detailed description, like reference numbers refer to like elements.

Referring now to the Figures, the several embodiments of the present invention will now be described. According to standard practice in the optical art, drawings of optical lens systems, such as those shown in certain of the Figures, have the object space, defined as all the space from the first element or surface of a system towards the object and beyond, on the left in the drawing. Similarly, the image space, defined as all the space from the last element or surface of a system towards the image and beyond, is on the right in the drawing.

Figure 2:
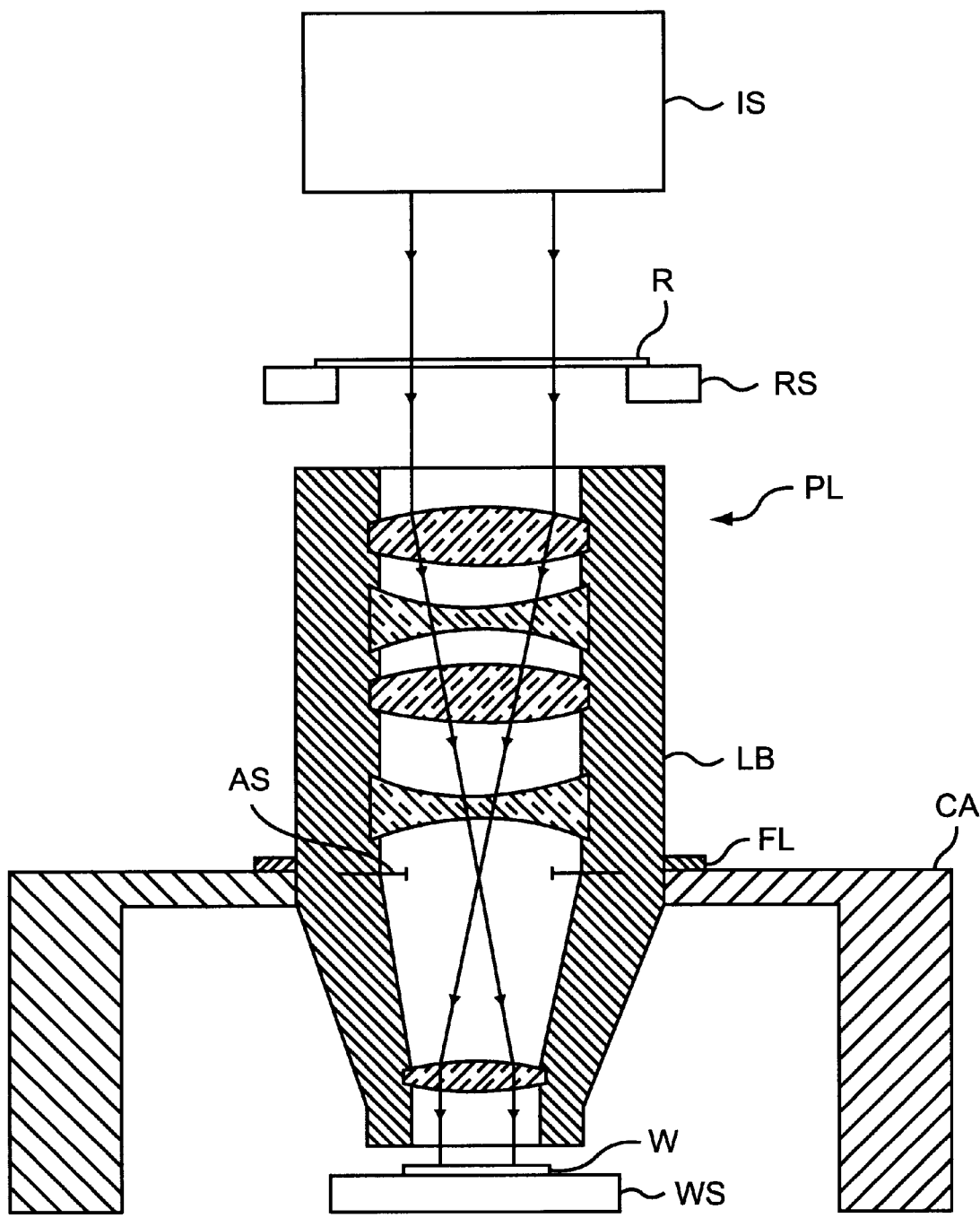
FIG. 2 is a simplified schematic drawing of a projection exposure system incorporating a projection optical system according to one embodiment of the present invention.

Referring to FIG. 2, an illumination system IS includes a suitable source of illumination, for example an excimer laser that uniformly illuminates a reticle R having formed thereon a pattern to be projected. Any suitable source of illumination may be utilized with the present invention, including but not limited to KrF or ArF laser sources and i-line illumination sources from a high-pressure mercury arc lamp. The reticle R is supported on a reticle stage RS. A wafer W onto which the pattern on the reticle is to be projected is supported and positioned by a wafer stage WS. Those skilled in the lithographic art will be familiar with reticle and wafer stages.

As can be seen in FIG. 2, a projection optical system PL is disposed between the reticle R and the wafer W and is contained within a lens barrel LB. The lens barrel LB may be provided with a flange FL to support the lens barrel LB in an appropriate position on a lens support structure CA. The light from the illumination system IS illuminates the reticle R and then enters the projection optical system PL. The image of the light source, which is in the illumination system IS, is formed at the pupil position (i.e., the position of the mechanical aperture stop AS), of the projection optical system PL. That is, the illumination system IS uniformly illuminates the reticle R under Koehler illumination. The projection optical system PL forms an image of the pattern on the reticle R on this wafer W. Thus, for example, if a circuit pattern is provided on the reticle R, this pattern is transferred onto the wafer W on the wafer stage WS. The mechanical aperture stop AS is constructed so as to change the diameter of itself.

Figure 3:
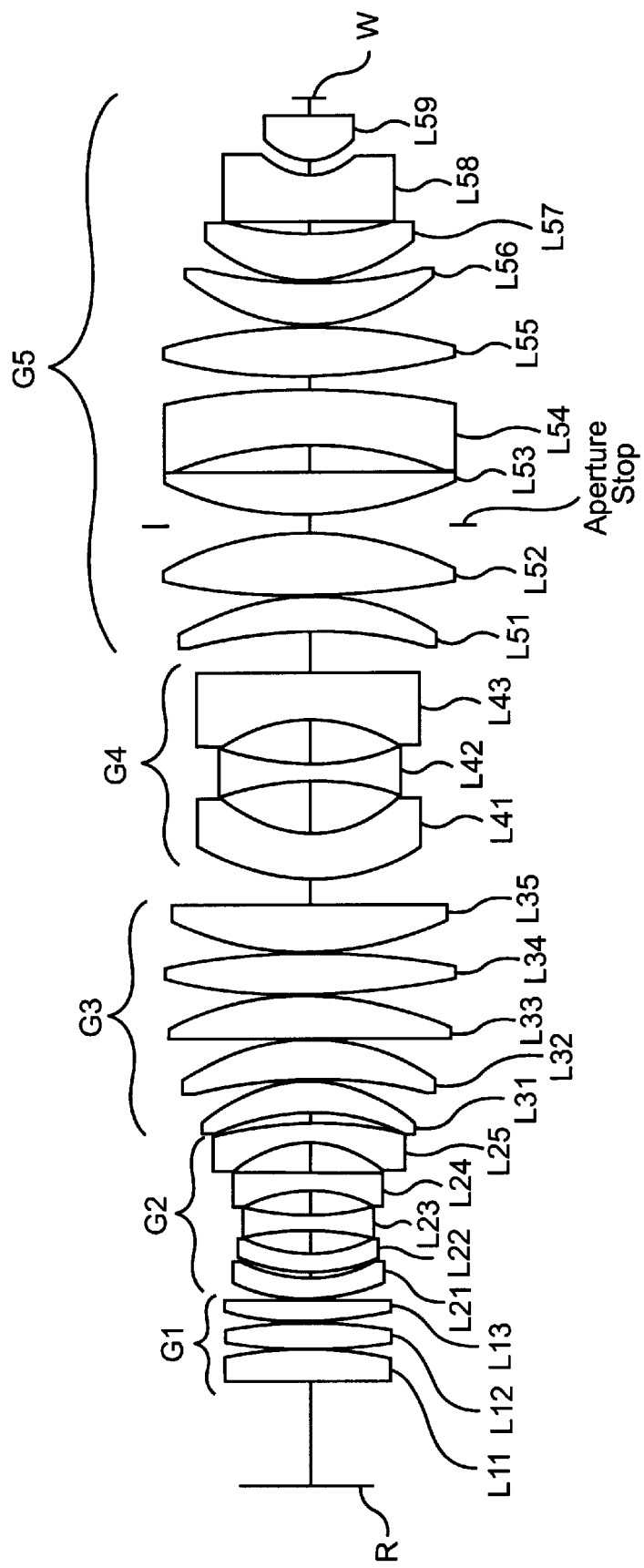
FIG. 3 is a side view of a projection lens system according to one embodiment of the present invention.
Figure 4:
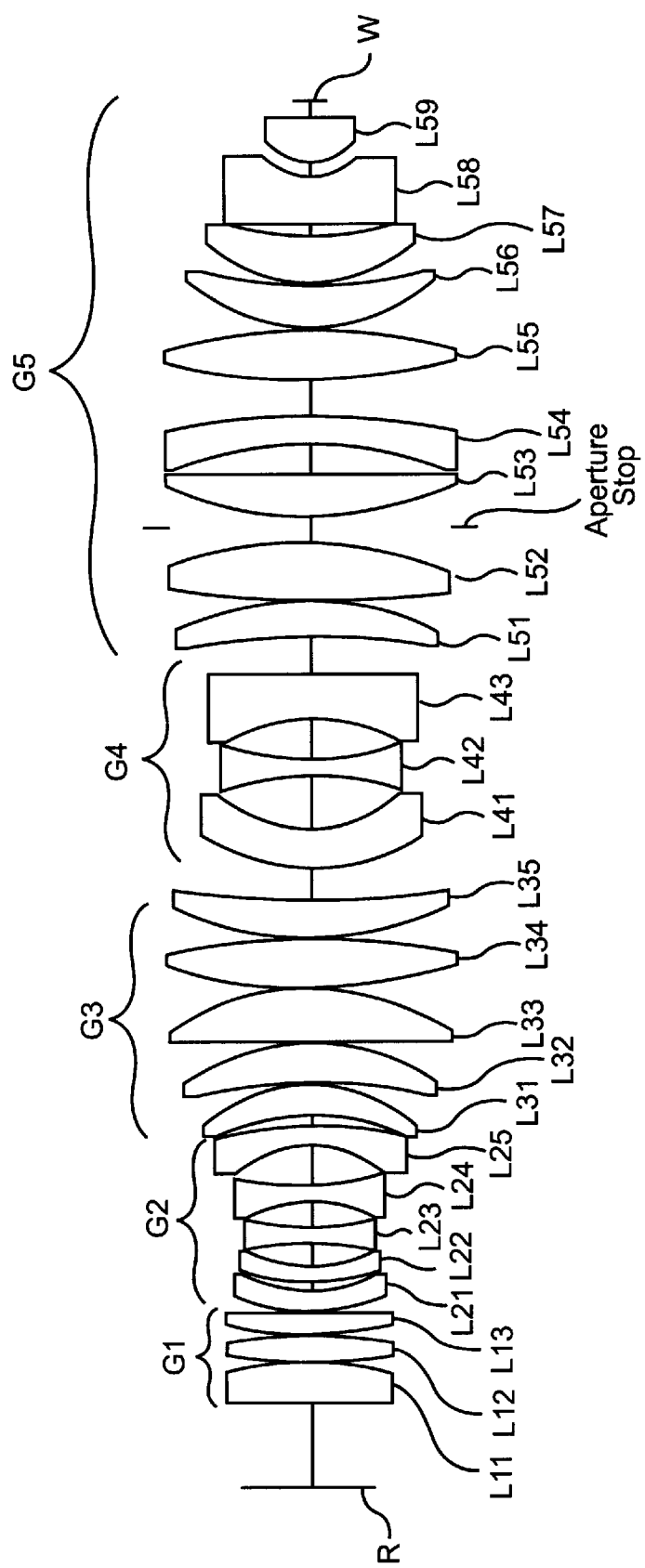
FIG. 4 is a side view of a projection lens system according to a second embodiment of the present invention.
Figure 8:
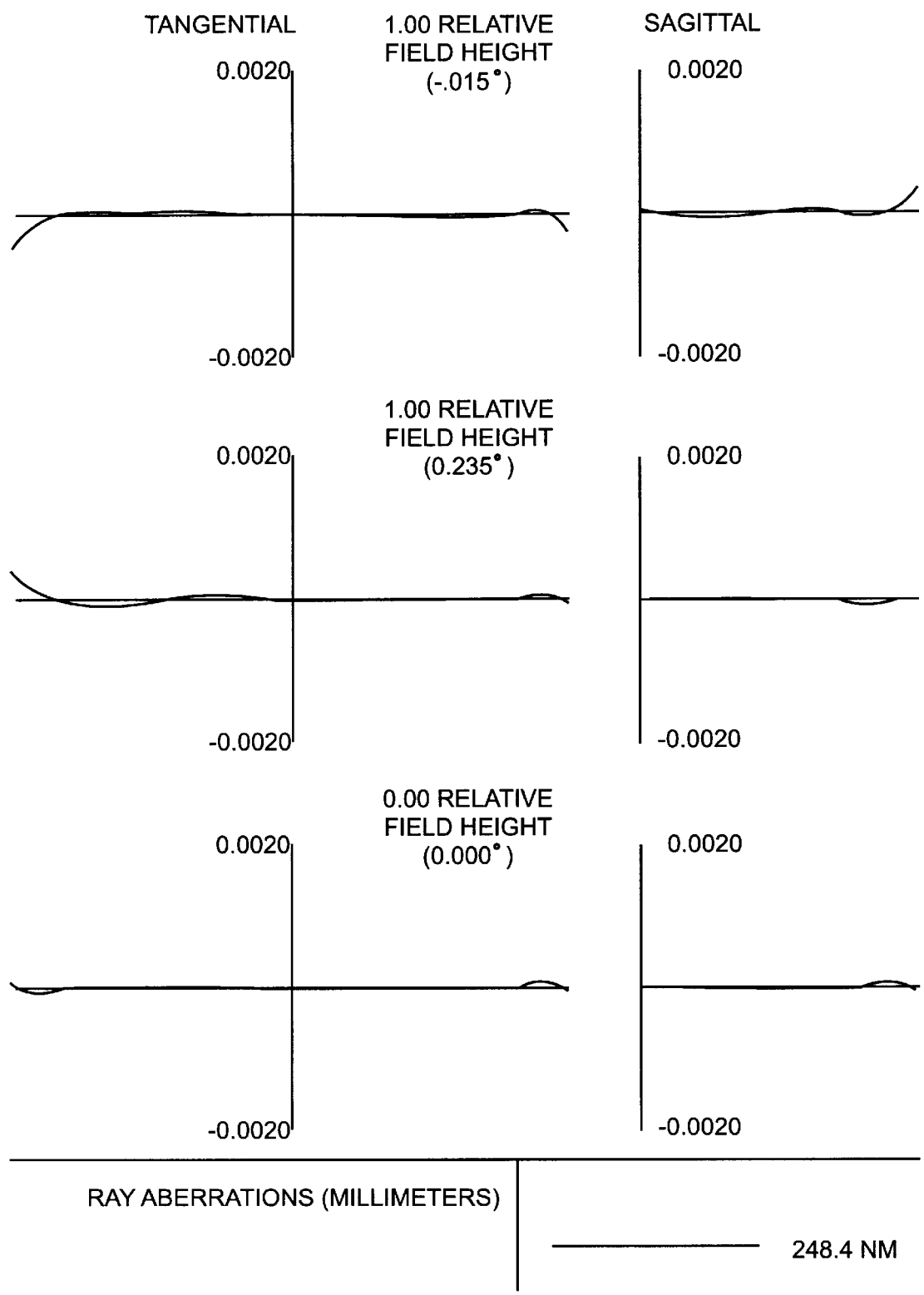
FIG. 8 is a graphical representation of lateral aberration associated with the projection optical system of FIG. 3.
Figure 12:
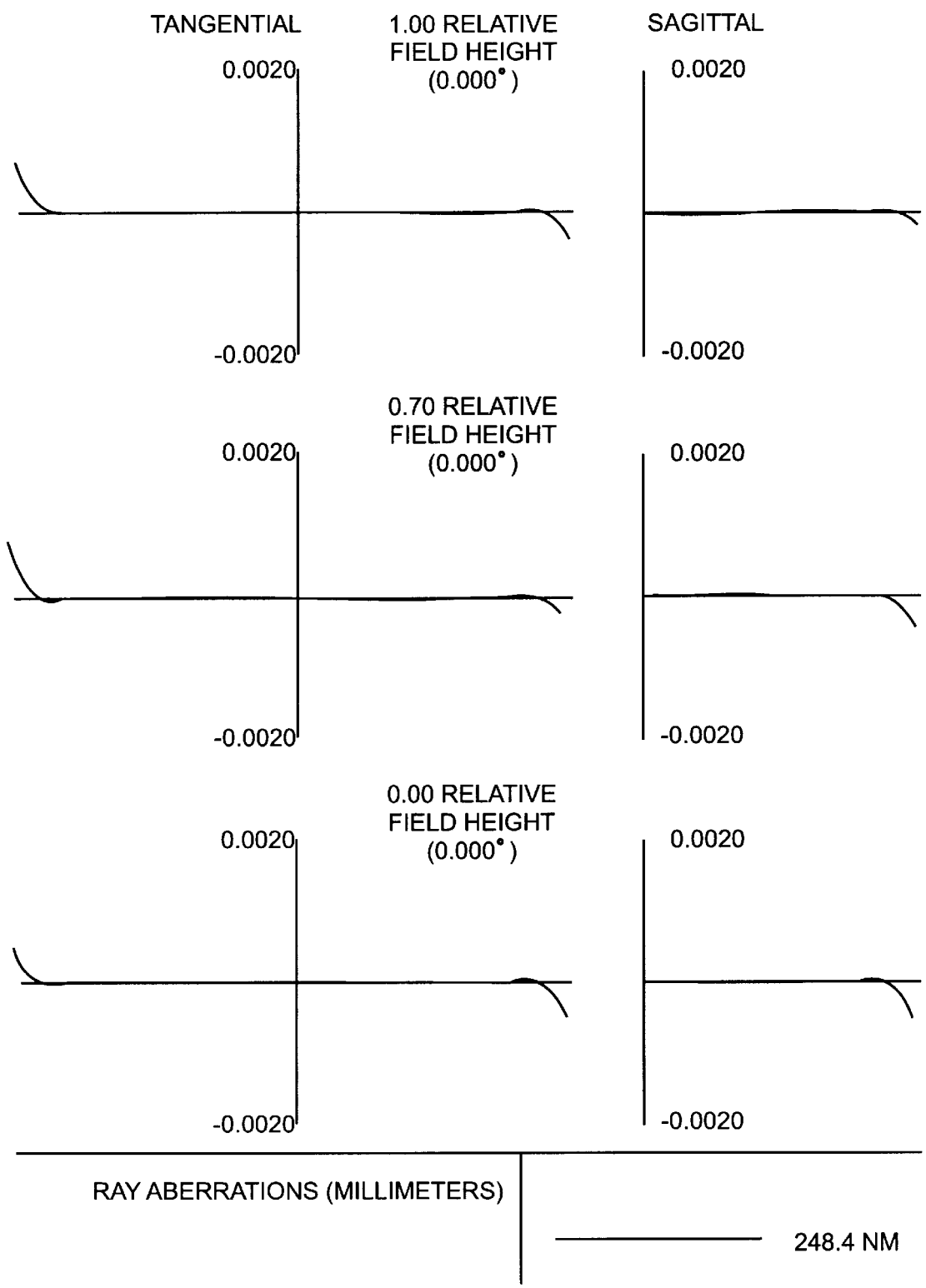
FIG. 12 is a graphical representation of lateral aberration associated with the projection optical system of FIG. 4.
Figure 13:
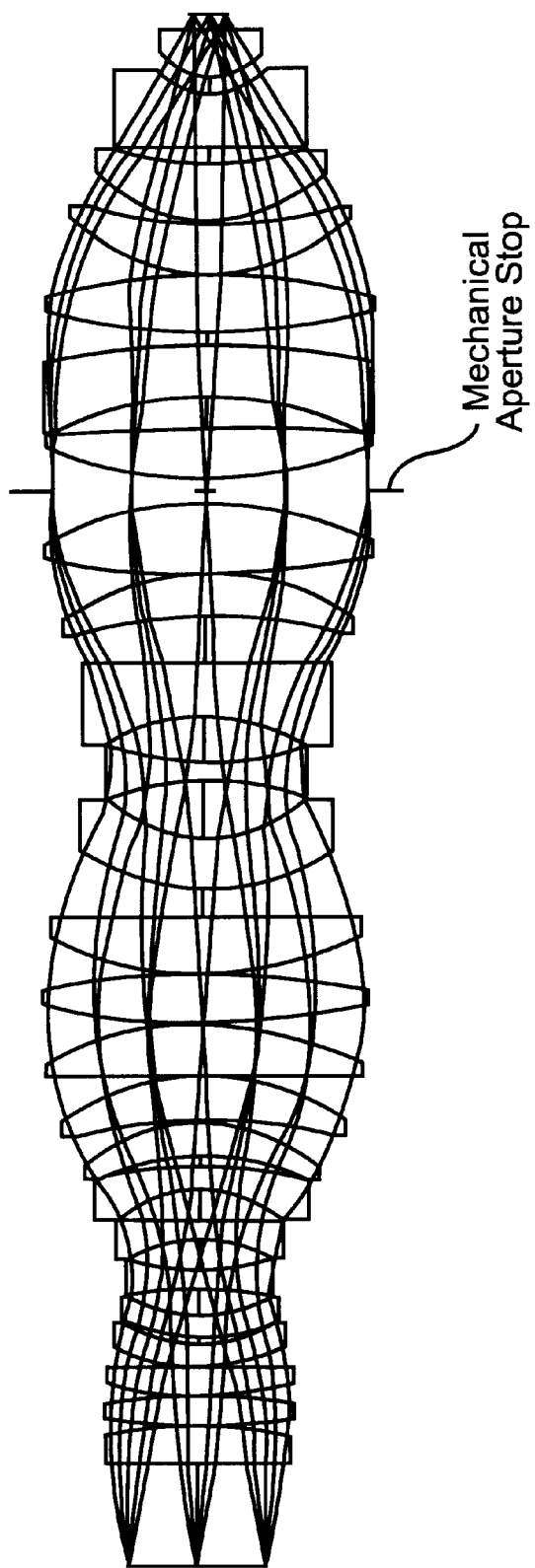
FIG. 13 is a ray tracing of the projection optical system of FIG. 3.
Figure 14:
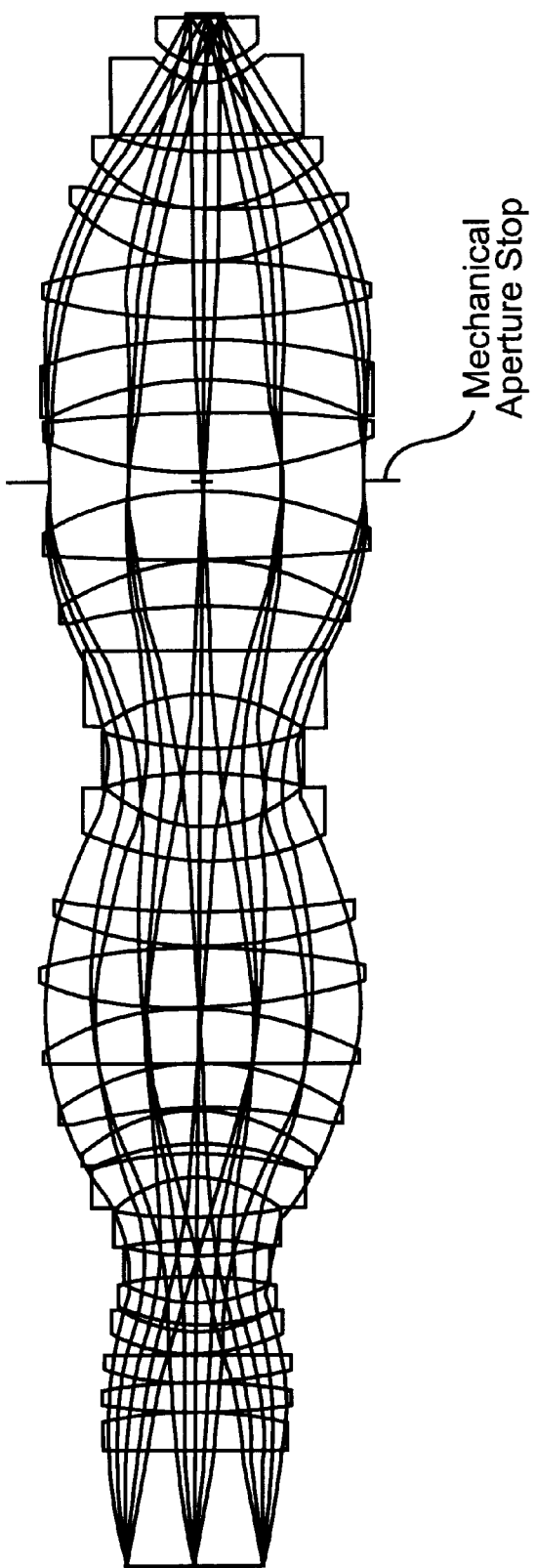
FIG. 14 is a ray tracing of the projection optical system of FIG. 4.

The projection optical system PL of FIG. 2 may include the projection lens systems shown in FIGS. 3 and 4. The projection lens systems shown in FIGS. 3 and 4 are structured in such a way to satisfy at least the following conditions:

$$-0.000005 < PTZ(1) + PTZ(2) < 0.000005 \quad (1)$$

$$-0.005 < PTZ(1) < 0.005 \quad (2)$$

where, $PTZ(1)$ is the Petzval sum of the projection optical system between a first object such as the reticle R and the aperture stop AS of the projection optical system PL; and $PTZ(2)$ is the Petzval sum of the projection optical system between the aperture stop AS and the second object such as the wafer W.

Condition (1) above is provided in order to insure that the image plane of the projection optical system is flat. This condition determines the ability of the projection optical system to produce a flat image plane. It is not desirable to go below the lower limit provided for condition (1) because the image plane of the projection optical system will become curved in a direction away from the first object (e.g. the reticle) at the corners of the imaging field. In addition, if the upper limit of condition (1) is exceeded, the image plane of the projection optical system will be curved in a direction toward the first object at the corners of imaging field.

Condition (2) is provided in order to insure that the pupil plane of the projection optical system is maintained flat. Thus, it is not desirable to go below the lower limit of condition (2) because the pupil plane will be curved toward the second object (e.g. the wafer W) at the edges of the pupil. It is not desirable to exceed the upper limit of condition (2) because the pupil plane will be curved toward the first object (e.g. the reticle R) at edges of the pupil. In addition, if the upper or lower limit of condition (2) is exceeded, when the numerical aperture (NA) is changed by changing the diameter of the mechanical aperture stop AS, phenomena such as asymmetrical vignetting will occur.

In a preferred embodiment of the present invention, the projection lens system illustrated in FIG. 3 will also satisfy the following conditions:

$$0.10 < f1/L < 0.25; \quad (3)$$

$$-0.09 < f2/L < -0.03 \quad (4)$$

$$0.05 < f3/L < 0.20; \quad (5)$$

$$-0.10 < f4/L < -0.02; \quad (6)$$

and $$0.05 < f5/L < 0.20, \quad (7)$$

where,
  f1 is the focal length of the first lens group G1,
  f2 is the focal length of the second lens group G2,
  f3 is the focal length of the third lens group G3,
  f4 is the focal length of the fourth lens group G4,
  f5 is the focal length of the fifth lens group G5, and
  L is the distance between object and image (i.e., the distance from the first object (e.g., reticle R) to the second object (e.g., wafer W)).

The above condition (3) is provided in order to determine the range of optical focal length of the first lens group G1 which has a positive refractive power. When outside the lower limit of condition (3), it becomes difficult to correct spherical aberration of the pupil. When the upper limit of condition (3) is exceeded, the correction of negative distortion becomes difficult.

Condition (4) determines the range of the optical focal length of the second lens group G2 which has a negative refractive power. When the upper limit of condition (4) is exceeded, it becomes difficult to correct for negative distortion. When the lower limit of condition (4) is exceeded, the reduction of the Petzval sum and the reduction of the total length of the projection optical system will become difficult.

Condition (5) determines the range of the optical focal length of the third lens group G3 which has a positive refractive power. When the upper limit of condition (5) is exceeded, the refractive power of the second or fourth lens group becomes weak, thus making the reduction of the total length and diameter of the lens system difficult. When the lower limit of condition (5) is exceeded, correction of coma aberration and distortion becomes difficult.

Condition (6) determines the range of the optical focal length of the fourth lens group G4 which has a negative refractive power. When the upper limit of condition (6) is exceeded, the correction of negative distortion becomes difficult. When the lower limit is exceeded, it becomes difficult to reduce the Petzval sum or reduce the total length of the projection optical system. It is desirable to reduce the Petzval sum in order to reduce the curvature of the image. It is desirable to reduce the total length of the projection optical system in order to reduce the weight of the system and to simplify the structure needed to support the projection optical system. It is desirable to reduce the maximum diameter of the lens elements in order to reduce the size of the lens barrel required to hold the lens elements.

Condition (7) determines the range of the optical focal length of the fifth lens group G5 which has a positive refractive power. When the upper limit of this condition is exceeded, the refractive power of the fifth lens group becomes too weak, resulting in an inevitable weakening of the refractive power of the fourth lens group. This makes it difficult to keep the Petzval sum small. When the lower limit of this condition is exceeded, correction of spherical aberration becomes difficult.

It is desirable for the projection optical system PL of this embodiment to have an aperture stop located in the fifth lens group. For example, if the aperture stop is located in the fourth lens group, the positive power of the fifth lens group would have to be reduced. As such, the maximum diameter of the fifth lens group would have to be larger. Since manufacturing capabilities and other concerns limit the maximum diameter of the lenses, it is preferable to avoid increasing the diameter of the lens elements. Placing the aperture stop within the fifth lens group assists in achieving this objective. If the aperture stop is located in the first, second or third lens group, it becomes difficult to satisfy conditions 3–7 above and to obtain a compact lens system.

Following is the explanation regarding structure of the projection optical system according to the embodiment based on data, referring to FIGS. 3 and 4. FIGS. 3 and 4 are diagrams showing lens structure of first and second embodiments respectively. Each of the embodiments shown in FIGS. 3 and 4 has, in order from the reticle R (or first object side) to the wafer W (or second object side), a first lens group G1 having a positive refractive power, a second lens group G2 having a negative refractive power, a third lens group G3 having a positive refractive power, a fourth lens group G4 having a negative refractive power, and a fifth lens group G5 having a positive refractive power. In the projection optical system according to the first and second embodiments, the first object side (reticle R side) and the second object side (wafer W side) are substantially telecentric, where a reduced image of the first object is transferred onto the second object.

Referring to the first embodiment of the projection optical system illustrated in FIG. 3, the first lens group G1 is comprised of, in order from the first object side, a double convex lens L11, a double convex lens L12 and a double convex lens L13.

The second lens group G2 is comprised of, in order from the first object side, a negative meniscus lens L21 with a concave surface directed to the second object side, a negative meniscus lens L22 with a concave surface directed to the second object side, a double concave lens L23, a double concave lens L24 and a negative meniscus lens L25 with a concave surface directed to the first object side.

The third lens group G3 is comprised of, in order from the first object side, a positive meniscus lens L31 with a convex surface directed to the second object side, a positive meniscus lens L32 with a convex surface directed to the second object side, a positive meniscus lens L33 with a convex surface directed to the second object side, a double convex lens L34 and a positive meniscus lens L35 with a convex surface directed to the first object side.

The fourth lens group G4 is comprised of, in order from the first object side, a negative meniscus lens L41 with a concave surface directed to the second object side, a double concave lens L42 and a double concave lens L43.

The fifth lens group G5 is comprised of, in order from the first object side, a positive meniscus lens L51 with a convex surface directed to the second object side, a double convex lens L52, the aperture stop, a double convex lens L53, a negative meniscus lens L54 with a concave surface directed to the first object side, a double convex lens L55, a positive meniscus lens L56 with a convex surface directed to the first object side, a positive meniscus lens L57 with a convex surface directed to the first object side, a negative meniscus lens L58 with a concave surface directed to the second object side and a positive meniscus lens L59 with a convex surface directed to the first object side.

As those skilled in the art will appreciate, Table 1 below provides the lens prescription for the embodiment of the projection optical system illustrated in FIG. 3. The numbers in the left end column indicate the order of optical surfaces from the object (reticle) side to the image (wafer) side. The value r is the radius of curvature (millimeters) of the lens surface (a positive radius of curvature indicates that the center of curvature is towards the right or image side and a negative radius of curvature indicates that the center of curvature is towards the left or reticle side). The value d is the axial distance (millimeters) to the next lens surface. In this embodiment, the distance L between the object and the image (the distance between the object surface to the image surface along the optical axis) is 1194.493 mm. The image side numerical aperture is 0.68. The projection magnification B is –¼. The size of the exposure field at the wafer W is 26.4 mm in diameter. The refractive index of all glass elements=1.508382 at a wavelength of 248.4 nanometers.

TABLE 1

| Surface number | Radius of curvature (mm) | axial distance (mm) | glass material |
|---|---|---|---|
| OBJ | INFINITY | 82.587839 | |
| 1 | 1598.37871 | 30.053434 | silica |
| 2 | –417.05896 | 1.000000 | |
| 3 | 503.31521 | 21.063176 | silica |

TABLE 1-continued

| Surface number | Radius of curvature (mm) | axial distance (mm) | glass material |
|---|---|---|---|
| 4 | −501.24931 | 1.000000 | |
| 5 | 319.32150 | 21.118796 | silica |
| 6 | −939.58621 | 1.000000 | |
| 7 | 199.70565 | 15.000000 | silica |
| 8 | 116.26508 | 7.237786 | |
| 9 | 174.42200 | 15.000000 | silica |
| 10 | 120.84092 | 19.108574 | |
| 11 | −362.18146 | 15.000000 | silica |
| 12 | 220.67477 | 21.772378 | |
| 13 | −126.71524 | 15.312943 | silica |
| 14 | 3111.99318 | 25.401340 | |
| 15 | −100.56982 | 17.341795 | silica |
| 16 | −322.85534 | 7.990353 | |
| 17 | −206.68417 | 26.118464 | silica |
| 18 | −143.28984 | 1.000000 | |
| 19 | −500.18111 | 34.865556 | silica |
| 20 | −191.41459 | 1.000000 | |
| 21 | −7831.82032 | 37.615116 | silica |
| 22 | −277.03928 | 1.000000 | |
| 23 | 547.12546 | 37.927001 | silica |
| 24 | −604.23930 | 1.054760 | |
| 25 | 275.99590 | 38.186931 | silica |
| 26 | 2062.19872 | 25.689963 | |
| 27 | 183.92980 | 40.000000 | silica |
| 28 | 117.13001 | 43.646082 | |
| 29 | −232.42351 | 15.386090 | silica |
| 30 | 214.62777 | 37.468675 | |
| 31 | −137.28190 | 40.000000 | silica |
| 32 | 4392.63800 | 35.553325 | |
| 33 | −428.94225 | 30.742465 | silica |
| 34 | −214.22913 | 1.062745 | |
| 35 | 696.57527 | 52.509440 | silica |
| 36 | −271.40165 | 8.000000 | |
| 37(STOP) | INFINITY | 9.931944 | |
| 38 | 310.65526 | 41.002268 | silica |
| 39 | −1658.65252 | 24.662242 | |
| 40 | −285.41323 | 40.000000 | silica |
| 41 | −722.86541 | 12.907438 | |
| 42 | 523.65129 | 42.625556 | silica |
| 43 | −459.16672 | 1.000000 | |
| 44 | 163.43705 | 39.514787 | silica |
| 45 | 470.50083 | 1.000000 | |
| 46 | 136.65783 | 40.000000 | silica |
| 47 | 276.01101 | 11.099540 | |
| 48 | 2946.36351 | 40.000000 | silica |
| 49 | 56.39038 | 14.566496 | |
| 50 | 53.68224 | 35.357806 | silica |
| 51 | 1314.21692 | 15.000000 | |
| IMG | INFINITY | 0.000000 | |

Table 2 shows the corresponding values for each condition (1) through (7) identified above for the first embodiment.

TABLE 2

| (1) | 0.0000049 |
|---|---|
| (2) | −0.0047 |
| (3) | 0.152 |
| (4) | −0.048 |
| (5) | 0.111 |
| (6) | −0.079 |
| (7) | 0.153 |

Referring to FIG. 4, the projection optical system according to the second embodiment has, in order from the side of reticle R as the first object, a first lens group G1 having a positive refractive power. A second lens group G2 has a negative refractive power while a third lens group G3 has a positive refractive power. A fourth lens group G4 has a negative refractive power, while the fifth lens group G5 has a positive refractive power.

The first lens group G1 includes, in order from the first object side, a plano-convex lens L11 with a convex surface directed to the second object (e.g. wafer) side, a double convex lens L12 and a double convex lens L13.

The second lens group G2 includes, in order from the first object side, a negative meniscus lens L21 with a concave surface directed to the second object side. A negative meniscus lens L22 is included in G2 and has a concave surface directed to the second object side. This is followed in turn by a double concave lens L23, a double concave lens L24 and a negative meniscus lens L25 with a concave surface directed to the first object side.

The third lens group G3 includes, in order from the first object side, a positive meniscus lens L31 with a convex surface directed to the second object side, a positive meniscus lens L32 with a convex surface directed to the second object side, a positive meniscus lens L33 with a convex surface directed to the second object side, a double convex lens L34 and a positive meniscus lens L35 with a convex surface directed to the first object side.

The fourth lens group G4 includes, in order from the first object side, a negative meniscus lens L41 with a concave surface directed to the second object side, a double concave lens L42 and a double concave lens L43.

The fifth lens group G5 includes, in order from the first object side, a positive meniscus lens L51 with a convex surface directed to the second object side, a double convex lens L52, the aperture stop, a double convex lens L53, a negative meniscus lens L54 with a concave surface directed to the first object side, a double convex lens L55, a positive meniscus lens L56 with a convex surface directed to the first object side, a positive meniscus lens L57 with a convex surface directed to the first object side, a negative meniscus lens L58 with a concave surface directed to the second object side and a positive meniscus lens L59 with a convex surface directed to the first object side.

Table 3 below provides the lens prescription for the embodiment of the projection optical system illustrated in FIG. 4. The parameter definitions are the same as those in Table 1 above. In this embodiment, the distance between the object and the image (the distance between the object surface to the image surface along the optical axis) L is 1200 mm. The image side numerical aperture is 0.64. The projection magnification B is −¼. The exposure field at the wafer W is 26.4 mm in diameter. The refractive index of all glass elements=1.508382 at a wavelength of 248.4 nanometers.

TABLE 3

| Surface number | Radius of curvature (mm) | axial distance (mm) | glass material |
|---|---|---|---|
| OBJ | INFINITY | 84.999999 | |
| 1 | INFINITY | 35.772106 | silica |
| 2 | −426.82686 | 1.000000 | |
| 3 | 447.76877 | 21.926922 | silica |
| 4 | −542.53692 | 1.000000 | |
| 5 | 249.24305 | 23.437508 | silica |
| 6 | −947.65439 | 1.000000 | |
| 7 | 208.69167 | 15.000000 | silica |
| 8 | 118.23751 | 9.280937 | |
| 9 | 224.77860 | 15.000000 | silica |
| 10 | 127.67317 | 23.483315 | |
| 11 | −169.68526 | 15.001326 | silica |
| 12 | 379.27379 | 11.689405 | |
| 13 | −302.53403 | 16.393900 | silica |
| 14 | 311.23186 | 30.310260 | |
| 15 | −106.72768 | 15.008614 | silica |
| 16 | −392.69540 | 9.972209 | |

TABLE 3-continued

| Surface number | Radius of curvature (mm) | axial distance (mm) | glass material |
|---|---|---|---|
| 17 | −205.33628 | 23.850294 | silica |
| 18 | −148.43373 | 1.010159 | |
| 19 | −429.02434 | 27.713361 | silica |
| 20 | −214.15117 | 1.006986 | |
| 21 | −5680.07463 | 44.948641 | silica |
| 22 | −224.61789 | 1.000000 | |
| 23 | 349.66908 | 47.412733 | silica |
| 24 | −531.40671 | 4.183506 | |
| 25 | 278.92972 | 32.344705 | silica |
| 26 | 930.49191 | 33.341137 | |
| 27 | 178.61021 | 31.461979 | silica |
| 28 | 121.69011 | 42.125460 | |
| 29 | −247.98307 | 18.026765 | silica |
| 30 | 209.62186 | 35.618157 | |
| 31 | −145.77717 | 40.098338 | silica |
| 32 | 1015.77429 | 38.031978 | |
| 33 | −573.23791 | 31.094551 | silica |
| 34 | −248.13149 | 1.000000 | |
| 35 | 1030.83591 | 49.411772 | silica |
| 36 | −289.46497 | 8.000000 | |
| 37(STOP) | INFINITY | 15.000000 | |
| 38 | 318.75587 | 38.626269 | silica |
| 39 | −1550.27591 | 25.174181 | |
| 40 | −263.60238 | 24.288345 | silica |
| 41 | −473.68298 | 16.529506 | |
| 42 | 453.73219 | 43.094068 | silica |
| 43 | −481.36234 | 1.018091 | |
| 44 | 161.28541 | 41.314986 | silica |
| 45 | 535.41353 | 1.011961 | |
| 46 | 136.43485 | 40.166646 | silica |
| 47 | 255.69078 | 11.010766 | |
| 48 | 2622.89894 | 40.017313 | silica |
| 49 | 54.81486 | 12.189990 | |
| 50 | 52.98901 | 31.361034 | silica |
| 51 | 1141.89150 | 17.239820 | |
| IMG | INFINITY | 0.000000 | |

The following TABLE 4 shows the corresponding values for conditions (1) through (7) for the embodiment of FIG. 4:

TABLE 4

| (1) | 0.0000034 |
|---|---|
| (2) | −0.0048 |
| (3) | 0.147 |
| (4) | −0.046 |
| (5) | 0.109 |
| (6) | −0.079 |
| (7) | 0.139 |

Those skilled in the field of optical design will readily recognize that FIGS. 5–8 graphically illustrate various aberrations of the first embodiment of the projection optical system illustrated in FIG. 3. More specifically, FIG. 5 graphically illustrates the spherical aberration associated with the first embodiment. FIG. 6 graphically illustrates the astigmatism for the first embodiment. FIG. 7 graphically illustrates distortion for the first embodiment and FIG. 8 graphically illustrates lateral aberration of the first embodiment.

Similarly, FIGS. 9–12 graphically illustrate various aberrations of the second embodiment of the projection optical system illustrated in FIG. 4. More specifically, FIG. 9 graphically illustrates the spherical aberration associated with the second embodiment. FIG. 10 graphically illustrates the astigmatism for the second embodiment. FIG. 11 graphically illustrates distortion for the second embodiment and FIG. 12 graphically illustrates lateral aberration of the second embodiment.

As those skilled in the art will appreciate from a review of the aberration diagrams, each of the above-described first and second embodiments are well corrected and achieve a good balance for the various aberrations. In addition, the performance of the projection optical system of the present invention is realized while also including relative high numerical apertures of 0.64 or 0.68.

In addition to the performance illustrated in the aberration plots and the drawing of the ray tracings, it can be determined that the field curvature of pupil is small for each embodiment. The reduction of field curvature of pupil is achieved by decreasing the Petzval sum PTZ(1).

The above embodiments utilize a KrF excimer laser as the illumination source, which supplies illumination at a wavelength of 248.4 nm. Of course, the present invention is not limited to use with a KrF excimer laser. Any suitable illumination source may be utilized with the present invention, including extreme ultraviolet light sources such as an ArF excimer laser supplying illumination having a wavelength of 193 nm, an F2 excimer laser supplying illumination having a wavelength of 157 nm, a mercury arc lamp capable of supplying g-line illumination having a wavelength of 436 nm and i-line illumination having a wavelength of 365 nm, as well as other ultraviolet light sources.

In addition, for each of the above embodiments, the index of refraction has been provided to identify the glass material. While the presently preferred lens material is silica, if the exposure light is not monochromatic, it may be necessary to construct the projection optical system from other types of optical materials. For example, a combination of silica lens elements and calcium fluorite ($CaF_2$) lens elements can be used to correct the chromatic aberration that would be introduced by the use of a non-monochromatic illumination source.

As those skilled in the art of projection optical systems will readily appreciate, numerous substitutions, modifications and additions may be made to the above design without departing from the spirit and scope of the present invention. It is intended that all such substitutions, modifications and additions fall within the scope of the present invention that is best defined by the claims appended below.

I claim:

1. A dioptric projection optical system for projecting an image of a first object onto a second object, the dioptric projection optical system having a numerical aperture of at least 0.63, the dioptric projection optical system comprising:
    a first lens portion;
    an aperture stop; and
    a second lens portion, wherein the first and second lens portions are disposed such that the first lens portion is between the first object and the aperture stop and the second lens portion is disposed between the aperture stop and the second object, wherein the first and second lens portions satisfy the following conditions:

$-0.000005 < PTZ(1) + PTZ(2) < 0.000005$, and $-0.005 < PTZ(1) < 0.005$, where, PTZ(1) is a Petzval sum of the first lens portion and PTZ(2) is a Petzval sum of the second lens portion.

2. The projection optical system according to claim 1, wherein the first and second lens portions include, in order from the first object side, a first lens group having a positive refractive power, a second lens group having a negative refractive power, a third lens group having a positive refractive power, a fourth lens group having a negative refractive power, and a fifth lens group having a positive refractive power.

3. The projection optical system according to claim 2, wherein the aperture stop is in the fifth lens group.

4. The projection optical system according to claim 2, wherein the projection optical system satisfies the following conditions:

$$0.10<f1/L<0.25$$

$$-0.09<f2/L<-0.03$$

$$0.05<f3/L<0.20$$

$$-0.10<f4/L<-0.02$$

$$0.05<f5/L<0.20$$

where,
f1 is the focal length of the first lens group,
f2 is the focal length of the second lens group,
f3 is the focal length of the third lens group,
f4 is the focal length of the fourth lens group,
f5 is the focal length of the fifth lens group, and
L is the distance between the object and the image.

5. The projection optical system according to claim 4, wherein the aperture stop is in the fifth lens group.

6. A projection exposure apparatus for transferring a pattern formed on a first object onto a second object, the projection exposure apparatus comprising:
a source of illumination for illuminating the first object;
a first stage for supporting the first object;
a dioptric projection optical system;
a second stage for supporting the second object, the projection optical system being disposed between the first and second stages for projecting illumination from the first object toward the second object, the dioptric projection optical system having a numerical aperture of at least 0.63 and including a first lens portion, an aperture stop, and a second lens portion, wherein the first and second lens portions are disposed such that the first lens portion is between the first object and the aperture stop and the second lens portion is disposed between the aperture stop and the second object, wherein the first and second lens portions satisfy the following conditions:

$$-0.000005<PTZ(1)+PTZ(2)<0.000005,$$

and $$-0.005<PTZ(1)<0.005,$$

where, PTZ(1) is a first Petzval sum of the first lens portion and PTZ(2) is a second Petzval sum of the second lens portion.

7. The projection exposure apparatus according to claim 6, wherein the first and second lens portions include, in order from the first object side, a first lens group having a positive refractive power, a second lens group having a negative refractive power, a third lens group having a positive refractive power, a fourth lens group having a negative refractive power, and a fifth lens group having a positive refractive power.

8. The projection exposure apparatus according to claim 7, wherein the aperture stop is in the fifth lens group.

9. The projection exposure apparatus according to claim 7, wherein the projection optical system satisfies the following conditions:

$$0.10<f1/L<0.25$$

$$-0.09<f2/L<-0.03$$

$$0.05<f3/L<0.20$$

$$-0.10<f4/L<-0.02$$

$$0.05<f5/L<0.20$$

where,
f1 is the focal length of the first lens group,
f2 is the focal length of the second lens group,
f3 is the focal length of the third lens group,
f4 is the focal length of the fourth lens group,
f5 is the focal length of the fifth lens group, and
L is the distance between the object and the image.

10. The projection exposure apparatus according to claim 9, wherein the aperture stop is in the fifth lens group.

11. A semiconductor manufacturing method for transferring a pattern formed on a reticle onto a photosensitive substrate, comprising the steps of:
illuminating the reticle with a source of illumination;
guiding the illumination from the reticle to a dioptric projection optical system having a numerical aperture of at least 0.63 and including a first lens portion, an aperture stop, and a second lens portion, wherein the first and second lens portions are disposed such that the first lens portion is between the reticle and the aperture stop and the second lens portion is disposed between the aperture stop and the photosensitive substrate, wherein the first and second lens portions satisfy the following conditions:

$$-0.000005<PTZ(1)+PTZ(2)<0.000005,$$

and $$-0.005<PTZ(1)<0.005,$$

where, PTZ(1) is a first Petzval sum of the first lens portion and PTZ(2) is a second Petzval sum of the second lens portion; and
exposing the photosensitive substrate with the guided illumination.

12. The semiconductor manufacturing method according to claim 11, wherein the first and second lens portions include, in order from the reticle side, a first lens group having a positive refractive power, a second lens group having a negative refractive power, a third lens group having a positive refractive power, a fourth lens group having a negative refractive power, and a fifth lens group having a positive refractive power.

13. The semiconductor manufacturing method according to claim 12, wherein the aperture stop is in the fifth lens group.

14. The semiconductor manufacturing method according to claim 12, wherein the projection optical system satisfies the following conditions:

$$0.10<f1/L<0.25$$

$$-0.09<f2/L<-0.03$$

$$0.05<f3/L<0.20$$

$$-0.10<f4/L<-0.02$$

$$0.05<f5/L<0.20$$

where, f1 is the focal length of the first lens group, f2 is the focal length of the second lens group, f3 is the focal length of the third lens group, f4 is the focal length of the fourth lens group, f5 is the focal length of the fifth lens group, and L is the distance between the object and the image.

15. The semiconductor manufacturing method according to claim 14, wherein the aperture stop is in the fifth lens group.

16. A projection optical system for projecting an image of a first object onto a second object, the projection optical system having a numerical aperture of at least 0.63, the projection optical system comprising:

a first lens portion;

an aperture stop; and a second lens portion, the first and second lens portions arranged along a single optical axis extending in a straight line, wherein the first and second lens portions are disposed such that the first lens portion is between the first object and the aperture stop and the second lens portion is disposed between the aperture stop and the second object, wherein the first and second lens portions satisfy the following conditions:

$$-0.000005 < PTZ(1) + PTZ(2) < 0.000005,$$

and $$-0.005 < PTZ(1) < 0.005,$$

where PTZ(1) is a Petzval sum of the first lens portion and PTZ(2) is a Petzval sum of the second lens portion.

17. The projection optical system according to claim 16, wherein the aperture stop is constructed so as to change the diameter of the aperture.

18. A projection exposure apparatus for transferring a pattern formed on a first object onto a second object, the projection exposure apparatus comprising:

a source of illumination for illuminating the first object;

a first stage for supporting the first object;

a projection optical system;

a second stage for supporting the second object, the projection optical system being disposed between the first and second stages for projecting illumination from the first object toward the second object, the projection optical system having a numerical aperture of at least 0.63 and including a first lens portion, an aperture stop, and a second lens portion, the first and second lens portions arranged along a single optical axis extending in a straight line, wherein the first and second lens portions are disposed such that the first lens portion is between the first object and the aperture stop and the second lens portion is disposed between the aperture stop and the second object, and wherein the first and second lens portions satisfy the following conditions:

$$-0.000005 < PTZ(1) + PTZ(2) < 0.000005,$$

and $$-0.005 < PTZ(1) < 0.005,$$

where PTZ(1) is a Petzval sum of the first lens portion and PTZ(2) is a Petzval sum of the second lens portion.

19. The projection exposure apparatus according to claim 18, wherein the aperture stop is constructed so as to change the diameter of the aperture.

20. A projection optical system for projecting an image of a first object onto a second object, the projection optical system having a numerical aperture of at least 0.63, the projection optical system comprising:

a first lens portion;

an aperture stop; and a second lens portion, wherein the first and second lens portions are disposed such that the first lens portion is between the first object and the aperture stop and the second lens portion is disposed between the aperture stop and the second object, wherein the first and second lens portions satisfy the following conditions:

$$-0.000005 < PTZ(1) + PTZ(2) < 0.000005,$$

and $$-0.005 < PTZ(1) < 0.005,$$

where PTZ(1) is a Petzval sum of the first lens portion and PTZ(2) is a Petzval sum of the second lens portion, and wherein illumination from the first object is guided to the second object without reflection through the projection optical system.

21. The projection optical system according to claim 1, wherein the aperture is constructed so as to change the diameter of the aperture.

* * * * *